United States Patent [19]

Shimizu et al.

[11] Patent Number: 5,173,478
[45] Date of Patent: Dec. 22, 1992

[54] PROCESS FOR PRODUCING OXIDE SUPERCONDUCTIVE MATERIAL BY FIRING AND APPARATUS THEREFOR

[75] Inventors: Hideki Shimizu, Nagoya; Takeyoshi Togashi, Okazaki, both of Japan

[73] Assignee: NGK Insulators, Ltd., Nagoya, Japan

[21] Appl. No.: 667,925

[22] Filed: Mar. 11, 1991

[30] Foreign Application Priority Data

Mar. 12, 1990 [JP] Japan ................................ 2-60616
Dec. 17, 1990 [JP] Japan ................................ 2-411178

[51] Int. Cl.$^5$ .................... H01B 12/06; C016 3/00; C04B 41/89; H01L 39/12
[52] U.S. Cl. ................................ 505/1; 505/742; 264/64; 501/152; 501/123
[58] Field of Search ............. 432/205, 206, 144, 152, 432/23, 200, 201, 203, 212, 258, 194; 505/1, 742; 264/64; 501/152, 123

[56] References Cited

U.S. PATENT DOCUMENTS

| | | | |
|---|---|---|---|
| 1,336,762 | 4/1920 | Swinnerton | 423/258 |
| 2,789,808 | 4/1957 | Blackman | 432/206 |
| 4,778,382 | 10/1988 | Sakashita | 432/152 |
| 4,854,860 | 8/1989 | Hemsath | 432/205 |
| 4,975,047 | 12/1990 | Mitsuhashi et al. | 432/23 |

OTHER PUBLICATIONS

Matacotta et al, "Determination of the Oxygen Content in Samples of ClBa$_2$Cu$_3$O$_{7-x}$ with Variable Oxygen Content", MRS Symp. Proce., vol. 99, Aug. 17, 1988, pp. 561–565.

Venturini et al, "Paramagnetic Spins in Oxygen-Loaded Ceramic La$_2$CuO$_{4+\delta}$" Extended Abstracts High-Temperature Superconductor II, MRS, Aug. 17, 1988, pp. 47–50.

Primary Examiner—Mark L. Bell
Assistant Examiner—C. Bonner
Attorney, Agent, or Firm—Armstrong & Kubovcik

[57] ABSTRACT

In a process or an apparatus for producing an oxide superconductive material by firing, a gas passage is formed in a firing furnace and a material to be fired, consisting of a ceramic superconductive powder and/or a powder expressing superconductivity when heated, is placed in the gas passage. A gas is passed through the gas passage in one direction to contact with the material. A both ends-opened cylindrical inorganic material is provided in a firing zone of a muffle of a bell-shaped furnace, and a bottomed cylindrical material of a substrate and an oxide superconductive layer is provided inside or outside the both ends-opened cylindrical inorganic material.

8 Claims, 9 Drawing Sheets

FIG.16

PROCESS FOR PRODUCING OXIDE SUPERCONDUCTIVE MATERIAL BY FIRING AND APPARATUS THEREFOR

BACKGROUND OF THE INVENTION AND DESCRIPTION OF THE RELATED ART

The present invention relates to a process for producing an oxide superconductive material by firing as well as to an apparatus therefor. More particularly, the present invention relates to a process for producing an oxide superconductive material by firing, which process can suitably carry out complete firing and oxidation of a ceramic superconductive powder, etc., as well as to an apparatus therefor.

The present invention further relates to a process for producing a bottomed cylindrical oxide superconductive material by firing, in an atmosphere enabling uniform firing, a bottomed cylindrical material comprising at least two layers of (a) a bottomed cylindrical substrate layer and (b) a layer to become an oxide superconductive layer when fired, formed on the substrate layer (a).

Oxide superconductive materials have drawn people's attention in recent years because they exhibit high critical temperatures, and their application in fields such as electric power, magnetic resonance imaging, magnetic shielding and the like are expected. In magnetic shielding apparatuses, in particular, use of a bottomed (one end-closed) cylindrical superconductive material is being tried for measurement of the very weak magnetism of living body.

Cylindrical oxide superconductive materials can generally be obtained in an integral form of (a) a cylindrical substrate and (b) an oxide superconductive layer provided thereon, by forming, on a cylindrical substrate made of a metal or the like, a layer to become an oxide superconductive layer and then subjecting them to firing.

For use in production of oxide superconductive material by firing, there are known various types of firing furnaces. An electric furnace is often used for the firing of a special ceramic which can be made at a high temperature and which must be made at a precisely controlled temperature.

Figure 14:
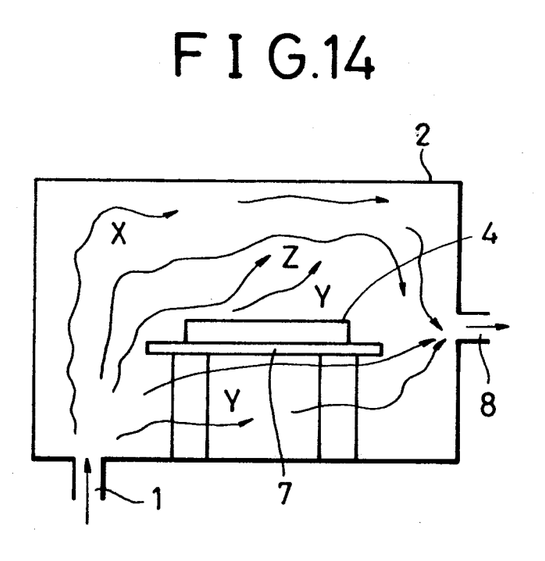
FIGS. 14 to 15 are each a sectional view showing a conventional firing furnace.
Figure 15:
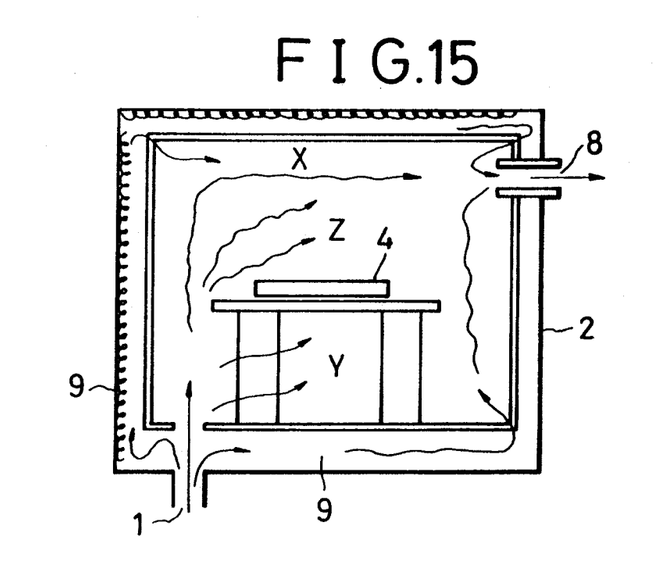

As the firing furnace used for the above-mentioned purpose, there is known, for example, a firing apparatus [conventional apparatus (1)] as shown in FIG. 14. In FIG. 14, a material 4 to be fired and become an oxide superconductive material is placed on a setter 7 provided in a firing furnace 2; an oxygen-rich gas is introduced into the furnace 2 through a gas inlet 1 to fire the material 4; the gas after firing is exhausted through a gas outlet 8. There is also known a firing apparatus [conventional apparatus (2)] as shown in FIG. 15. In FIG. 15, an oxygen-rich gas is introduced into a firing furnace 2 through a gas passage 9 provided outside a muffle of the furnace 2; the gas after firing is exhausted through a gas outlet 8.

In the firing of, in particular, a layer to become an oxide superconductive layer when fired, formed on a cylindrical substrate, it is impossible to use a furnace of hanging bell type, a so-called bell-shaped furnace. This bell-shaped furnace is the same as generally used for uniform heating of wire material (e.g. steel wire) or thin tube coil or for heat treatment of said linear material or thin tube in a particular atmosphere or under vacuum in a state isolated from the outside.

Figure 16:
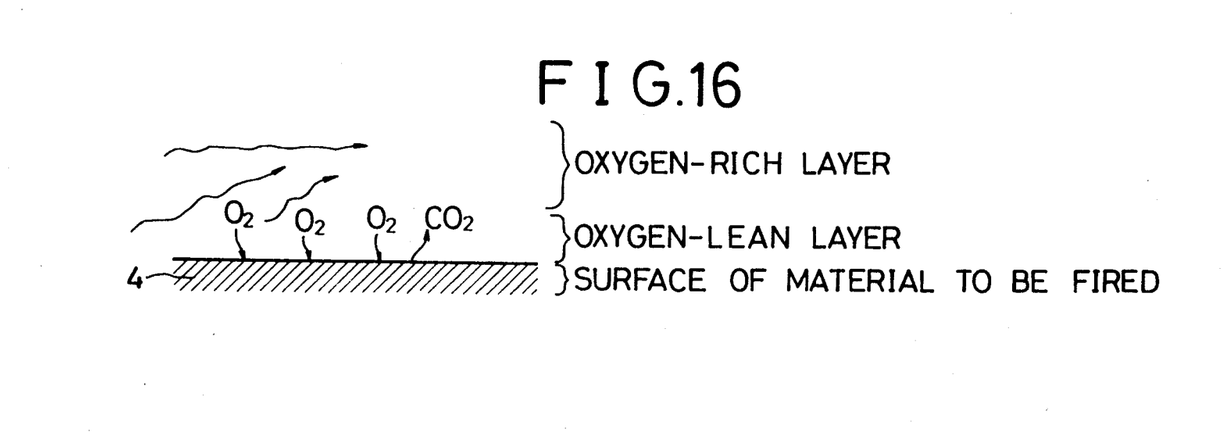
FIG. 16 is a drawing showing the surface condition of a material to be fired when the material is fired in a conventional firing furnace.

In the conventional apparatuses (1) and (2), however, the oxygen-rich gas introduced through the gas inlet 1 gives rise to a stream X which proceeds to the upper portion of the firing furnace 2 owing to the gas speed at the inlet 1 and a stream Y which stays at the lower portion of the firing furnace 2 owing to its temperature being lower than that inside the remainder of the furnace and then is heated by a heating element and rises to the upper portion of the furnace. When the flow rate is increased, the proportion of the stream X increases and, when the flow rate is decreased, the proportion of the stream Y increases. In either case, the stream X and the stream Y collide with each other above the material 4 to be fired, whereby turbulence in gas flow is generated, making it impossible to produce unidirectional gas flow in the vicinity of the material to be fired. When there is generated such a turbulent flow, even when the discharge gas from the gas outlet 8 contains oxygen in a high concentration of 80% or more, an oxygen-lean gas layer is present at the surface of the material 4 to be fired, as a result of an oxygen absorption reaction, as shown in FIG. 16; consequently, there remains, in the sintered material obtained, unreacted carbon derived from binder, etc. which are an organic substance or a carbonate, and the sintered material inevitably has low superconductivity.

It is an object of the present invention to provide a process for producing an oxide superconductive material by firing, in which process a gas of unidirectional flow is generated in a firing furnace so that no oxygen-lean gas layer is present on the surface of a material to be fired, placed in the firing furnace, as well as an apparatus therefor.

It is also an object of the present invention to provide a process for producing a bottomed cylindrical oxide superconductive material of desired form by firing, in which process a layer to become an oxide superconductive layer when fired, formed on a bottomed cylindrical substrate can be subjected to uniform firing.

SUMMARY OF THE INVENTION

According to the present invention, there is provided a process for producing an oxide superconductive material by firing, which process comprises forming a gas passage in a firing furnace, placing in the gas passage a material to be fired, consisting of a ceramic superconductive powder and/or a powder expressing superconductivity when heated, and passing through the gas passage a gas of given composition in one direction to contact the gas with the material to be fired.

According to the present invention, there are also provided an apparatus for producing an oxide superconductive material by firing, which apparatus comprises a firing furnace and a gas passage formed therein by a jig, in which gas passage a material to be fired, consisting of a ceramic superconductive powder and/or a powder expressing superconductivity when heated is placed and through which gas passage a gas of given composition is passed in one direction, and an apparatus for producing an oxide superconductive material by firing, which apparatus comprises a firing furnace, straightening louver(s) provided at the gas inlet side and/or gas outlet side of the firing furnace, and fan(s) provided upstream and/or downstream of the gas inlet, in which firing furnace a material to be fired, consisting of a ceramic superconductive powder and/or a powder expressing superconductivity when heated is placed and a gas of given composition is passed in one direction and contacted with the material to be fired.

The present invention also provides a process for producing a bottomed cylindrical oxide superconductive material by firing, which process comprises providing a both ends-opened cylindrical inorganic material in the firing zone of a muffle of a bell-shaped furnace, providing, inside the both ends-opened cylindrical inorganic material, a bottomed cylindrical material comprising (a) a bottomed cylindrical substrate and (b) a layer to become an oxide superconductive layer when fired, formed on the outer surface of the bottomed cylindrical substrate (a), with the bottom of the cylindrical material directed upward, and passing a gas from the outer surface of the both ends-opened cylindrical inorganic material to its inner surface or from the inner surface to the outer surface to keep the entire part of the layer (b) to become an oxide superconductive layer when fired, in an atmosphere enabling uniform firing and effect firing of the layer (b) under this condition.

The present invention further provides a process for producing a bottomed cylindrical oxide superconductive material by firing, which process comprises providing a both ends-opened cylindrical inorganic material in the firing zone of a muffle of a bell-shaped furnace, providing, outside the both ends-opened cylindrical inorganic material, a bottomed cylindrical material comprising (a) a bottomed cylindrical substrate and (b) a layer to become an oxide superconductive layer when fired, formed on the inner surface of the bottomed cylindrical substrate (a), with the bottom of the cylindrical material directed upward, and passing a gas from the outer surface of the both ends-opened cylindrical inorganic material to its inner surface or from the inner surface to the outer surface to keep the entire part of the layer (b) to become an oxide superconductive layer when fired, in an atmosphere enabling unifirom firing and effect firing of the layer (b) under this condition.

The present invention furthermore provides a process for producing a bottomed cylindrical oxide superconductive material by firing, which process comprises providing, in the firing zone of a bell-shaped furnace, a bottomed cylindrical material comprising (a) a bottomed cylindrical substrate and (b) a layer to become an oxide superconductive layer when fired, formed on the inner surface of the bottomed cylindrical substrate (a), with the bottom of the cylindrical material directed upward, providing a both ends-opened cylindrical inorganic material inside the bottomed cylindrical material, and passing a gas from the outer surface of the both ends-opened cylindrical inorganic material to its inner surface or from the inner surface to the outer surface to keep the entire part of the layer (b) to become an oxide superconductive layer when fired, in an atmosphere enabling uniform firing and effect firing of the layer (b) under this condition.

The present invention is characterized in that unidirectional gas flow is generated in a firing furnace.

As the preferable methods for generating unidirectional gas flow in a firing furnace, there are mentioned (1) a method wherein a gas passage is formed in a firing furnace by means of a jig to generate unidirectional gas flow, and a method (2) wherein straightening louver(s) and fan(s) are provided in a firing furnace to generate unidirectional gas flow.

Thus, in the present invention, unidirectional gas flow is generated in a firing furnace; thereby, the surface of a material to be fired, placed in the furnace is constantly contacted with an oxygen-rich gas and no oxygen-lean gas layer is made present; consequently, it is possible to produce an oxide superconductive material of excellent superconductivity in which no unreacted carbon remains as a result of complete oxidation.

Further in the present invention, a gas is allowed to pass in a desired flow pattern in the muffle of a firing furnace; thereby, a layer to become an oxide superconductive layer when fired, formed on the outer or inner surface of a bottomed cylindrical substrate placed in the furnace is constantly contacted with a gas of given temperature and uniform $O_2$ concentration. Consequently, the layer to become an oxide superconductive layer is fired in a gas atmosphere of given temperature and composition, and the resulting bottomed cylindrical superconductive material can express excellent superconductivity and excellent magnetic shielding property and can be used as a magnetic shielding material enabling measurement of the very weak magnetism of living body, etc.

Incidentally, the oxide superconductive material used in the present invention is generally a Y-Ba-Cu-O type compound or a Bi-Sr-Ca-Cu-O type compound each having a multi-layered perovskite structure.

BRIEF DESCRIPTION OF THE DRAWINGS

FIGS. 2(a) and 2(b) are sectional views showing other examples of the present invention. FIG. 2(a) is a sectional view and FIG. 2(b) is a plan view.

DETAILED DESCRIPTION OF PREFERRED EMBODIMENTS

The present invention is described in more detail with reference to the embodiments shown in the accompanying drawings. However, the present invention is in no way restricted to these embodiments.

Figure 1:
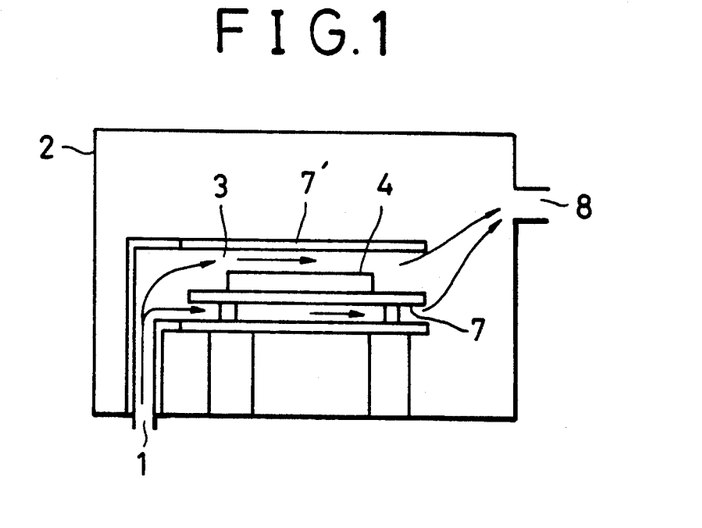
FIG. 1 is a sectional view showing an example of the present invention.

FIG. 1 is a sectional view of a firing furnace as an example of the present invention, having therein a gas passage formed by a jig.

An oxygen-rich gas is introduced into a firing furnace 2 through a gas inlet 1 and passes through a gas passage 3 formed in the furnace 2 by a jig 7'. In the gas passage 3 is placed a material 4 to be fired. The oxygen-rich gas is contacted with the material 4 to be fired, in a unidirectional flow and then discharged out of the firing furnace 2 through a gas outlet 8.

Thus, by forming the gas passage 3 in the firing furnace 2, the gas flow in the firing furnace 2 has no turbulence and the contact of the oxygen-rich gas with the material 4 to be fired becomes uniform. As a result, the material 4 to be fired is always contacted with a gas of high oxygen concentration and oxidized, and the resulting oxide superconductive material contains a very small amount of unreacted carbon and has excellent superconductive property (Jc).

Figure 2A:
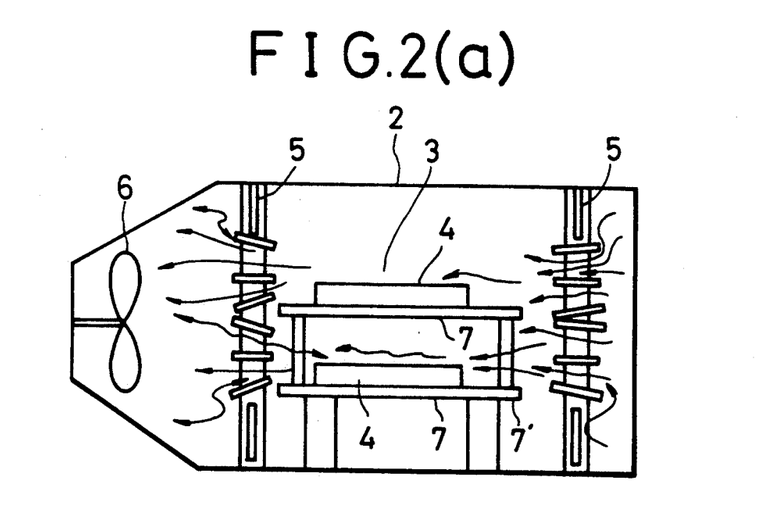
Figure 2B:
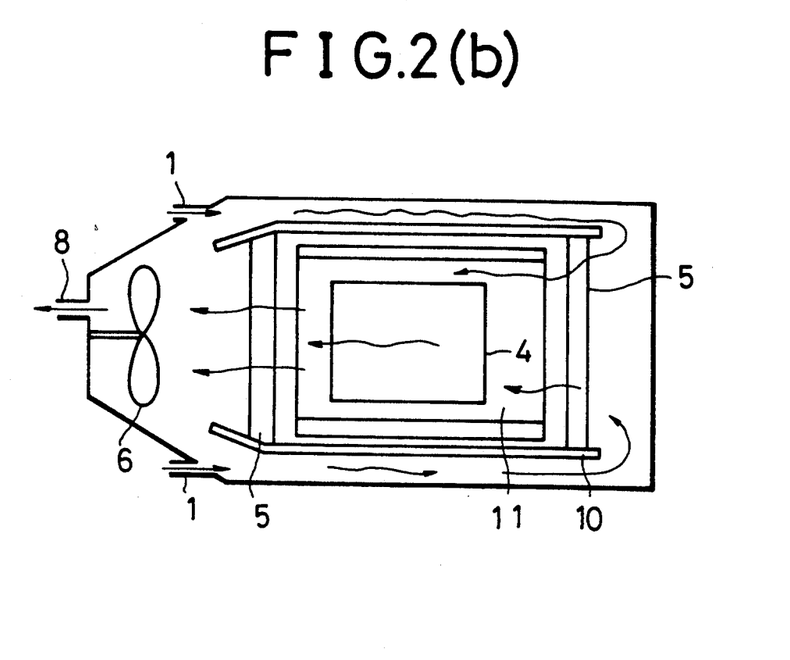

FIG. 2 shows another example of the present invention, wherein straightening louvers are provided at the upstream and downstream sides of a firing furnace and a fan is provided downstream of the downstream side straightening louvers.

In FIG. 2, a gas passage 3 is formed in a firing furnace 2 by straightening louvers 5 and a fan 6; therefore, an oxygen-rich gas of high temperature introduced into the firing furnace is contacted with a material 4 to be fired, uniformly in a unidirectional flow, and there can be obtained an oxide superconductive material having excellent superconductive property (Jc).

As the material for the jig 7' for formation of a gas passage provided in the firing furnace, there are used alumina, recrystallized silicon carbide, zirconia, magnesia, fire brick, inorganic fiber board, etc. A material of small heat capacity is preferred because with such a material it is possible to make small the difference between the temperature of the material to be fired and the controlled temperature inside the firing furnace, as well as the delay of the temperatures of the jig 7' and the material 4 to be fired, against the temperature of the atmosphere inside the furnace at the time of temperature increase or decrease.

When the material to be fired is placed in a unidirectional flow of introduced gas, the gas flow rate at the surface of the material to be fired is desirably 5-100 cm/min.

When the oxygen-rich gas is preheated by a preheating chamber (not shown) to a temperature close to the temperature inside the furnace and then introduced through the inlet 1 into the gas passage wherein the material to be fired is placed, the temperature inside the furnace can be controlled more easily and becomes more uniform. When the flow rate of unidirectional flow gas at the surface of the material to be fired is more than 100 cm/min, the volume of the preheating chamber necessary to keep uniform the temperature inside the furnace becomes too large, and such a volume is not preferable for industrial application. When the introduced gas is not circulated in the furnace but is passed over the surface of the material to be fired, in a unidirectional flow and is discharged, the flow rate of the unidirectional gas flow formed to remove the oxygen-lean gas layer present on the material to be fired is sufficiently 100 cm/min or less.

In the gas passage formed by a jig, it is preferable that the distance between the inner wall of the jig and the surface of the material to be fired be small in order to make good the contact between the gas flow and the material to be fired.

Figure 3:
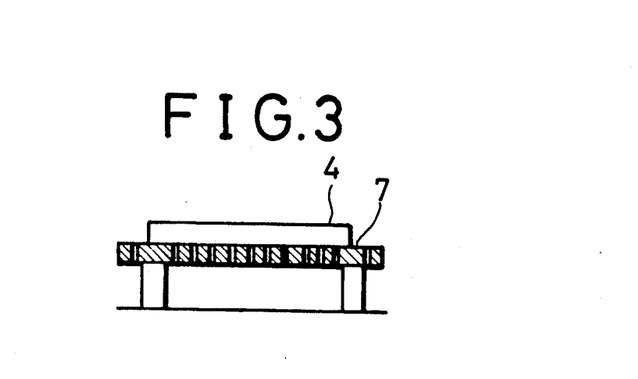
FIG. 3 is a schematic view showing a support for a material to be fired.

Use of a porous plate as shown in FIG. 3, as a bearer 7 for the material 4 to be fired, is preferable because it enables the contact of the oxygen-rich gas even with the lower surface of the material to be fired and ensures uniform firing of the material to be fired.

In the example of FIG. 2, it is preferable that the louvers constituting the straightening louver 5 at the gas inlet side be opened wide at the furnace outer side and narrow at the furnace inner side and the louvers constituting the straightening vanes 5 at the gas outlet side be opened wide at the furnace inner side and narrow at the furnace outer side, because such opening of the louvers enables the concentration of the gas flow on the surface of the material to be fired and allows good contact of the material to be fired, with the gas of unidirectional flow.

It is preferable that a fan 6 be provided at the gas outlet side and the gas after firing be forcibly drawn by the suction of the fan in a unidirectional flow from the firing chamber 11 defined by a partition 10 and the straightening louvers 5. It is also preferable that a fan (not shown) be provided at the gas inlet side and thereby a gas be fed into the firing chamber 11 in a unidirectional flow. It is further preferable that two fans be provided at the gas inlet side and the gas outlet side and thereby the gas flow in the firing chamber 11 will be made a unidirectional flow more forcibly.

By thus making unidirectional the gas flow in the firing chamber 11, the surface of the material to be fired can be always contacted with a fresh gas and thereby the formation of an oxygen-lean gas layer can be prevented, the temperature distribution inside the firing chamber 11 becomes uniform, and there can be obtained an oxide superconductive material excellent in superconductivity and and low in unevenness of properties.

Figure 4:
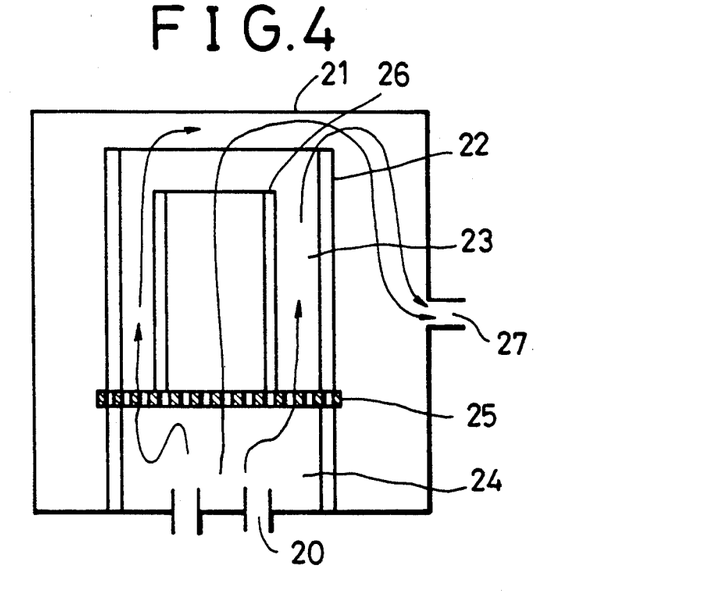
FIGS. 4 to 6 are each a sectional view showing an example of a firing furnace in which a cylindrical material is fired.
Figure 5:
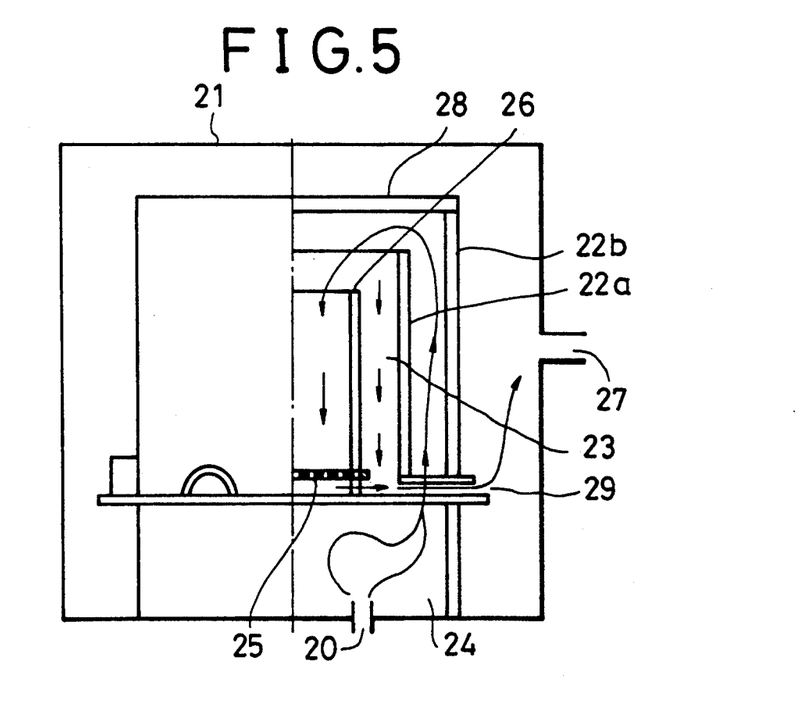
Figure 6:
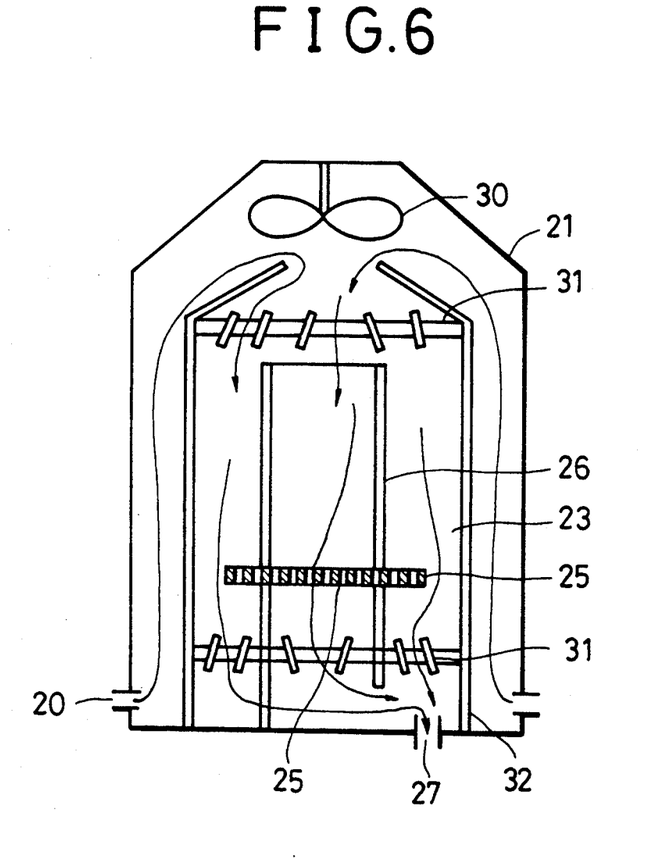

FIGS. 4 to 6 are each an example of a firing furnace used for firing of a cylindrical material.

In the example of FIG. 4, an oxygen-rich gas introduced through a gas inlet 20 is heated to a desired temperature at a heating chamber 24 provided beneath a firing chamber 23 formed by a sugger 22 made of a refractory and becomes a rising stream of unidirectional flow. The stream proceeds upward in contact with the surface of a cylindrical material 26 to be fired, placed on a support 25 made of a porous plate and is discharged out of a firing furnace 21 through a gas outlet 27.

In the example of FIG. 5, an oxygen-rich gas is heated at a heating chamber 24 and becomes a rising stream. The stream proceeds upward between an inner casing 22a and an outer casing 22b, and collides with a cover 28 of the outer casing 22b and becomes a downward stream. The stream proceeds downward in a unidirectional flow in a firing chamber 23 defined by the inner casing 22a, in contact with the surface of a cylindrical material 26 to be fired, leaves the firing chamber 23 out of the outer casing 22b through an opening 29 provided at the bottom of the casings 22a and 22b, and is discharged out of a firing furnace 21 through a gas outlet 27.

FIG. 6 is an example of a firing furnace using a fan and straightening louvers, in which furnace a cylindrical material 26 to be fired is placed in a firing chamber 23 defined by a partition 32 and straightening louvers 31. An oxygen-rich gas introduced through a gas inlet 20 is heated in the vicinity of a heating element and becomes a rising stream. The stream is forcibly converted to a downward stream by a fan 30 provided at the top of a firing furnace 21. The downward stream is straightened by a straightening louver 31, proceeds downward in a unidirectional flow in contact with the surface of a cylindrical material 26 to be fired, placed on a bearer 25, and then is discharged out of the firing furnace 21 through a gas outlet 27 provided at the bottom of the firing furnace 21 inside a partition 32.

Figure 11:
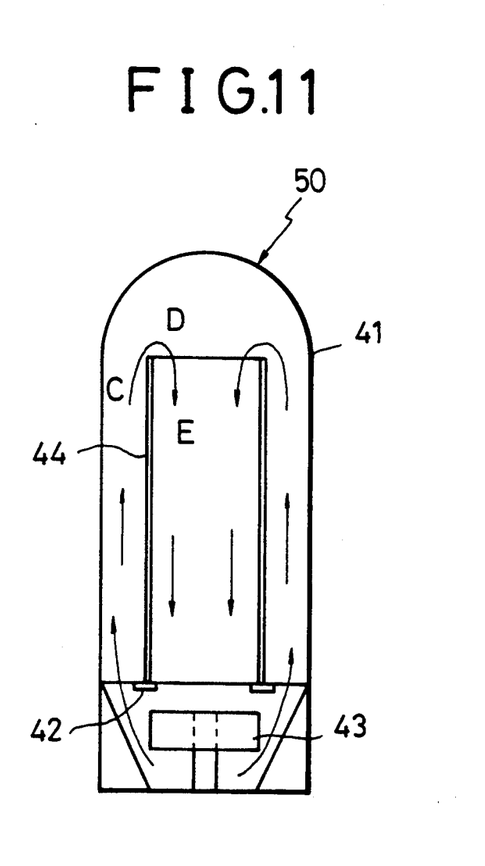
FIGS. 11 to 13 are each a sectional view showing an example of a bell-shaped furnace wherein a cylindrical material is fired.
Figure 12:
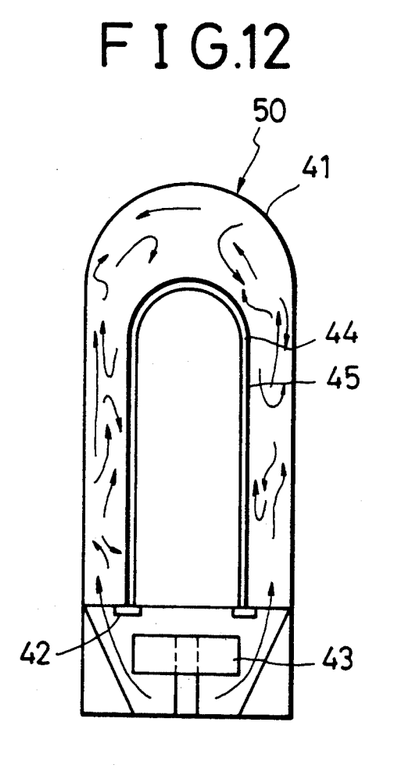
Figure 13:
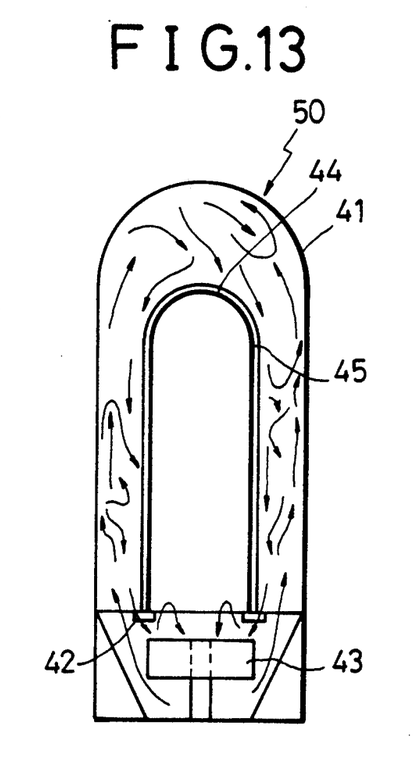

FIGS. 11 to 13, similarly to FIGS. 4 to 6, each shows a sectional view of a firing furnace used for firing of a cylindrical material. In FIGS. 11 to 13, a fan 43 is provided at the bottom of a bearer 42 in a muffle 41 of a bell-shaped furnace 50; a both ends-opened cylindrical material 44 to be fired is placed on the bearer 42; and an atmosphere in the muffle 41 is forcibly stirred by heat convection and the action of the fan to uniformize the atmosphere in the muffle 41.

When the cylindrical material 44 to be fired is opened at both ends as shown in FIG. 11, even if the material 44 consists of a cylindrical substrate and a layer to become an oxide superconductive material when fired, formed on either surface of the cylindrical material, as shown in FIGS. 4 to 6, the atmosphere in the muffle 41 is circulated from the outer surface of the cylindrical material 44 to its inner surface in the order of C to D to E, whereby the firing atmosphere is substantially uniformized and uniform firing can be effected.

When the cylindrical material 44 to be fired is closed in one end and consists of a cylindrical substrate 44 and a layer 45 to become an oxide superconductive layer when fired, formed on the outer surface of the substrate 44 as shown in FIG. 12 or consists of a cylindrical substrate 44 and a layer 45 to become an oxide superconductive layer when fired, formed on the inner surface of the substrate 44 as shown in FIG. 13, the atmosphere in the muffle cannot be made substantially uniform even by the action of a fan and becomes turbulent when a conventional bell-shaped furnace is used; therefore, the layer to become an oxide superconductive layer when fired, formed on the cylindrical substrate cannot be fired in a uniform atmosphere and the cylindrical oxide superconductive material obtained cannot express excellent superconductivity.

FIGS. 7 to 10 show examples of the present invention for firing bottomed cylindrical materials.

Figure 7:
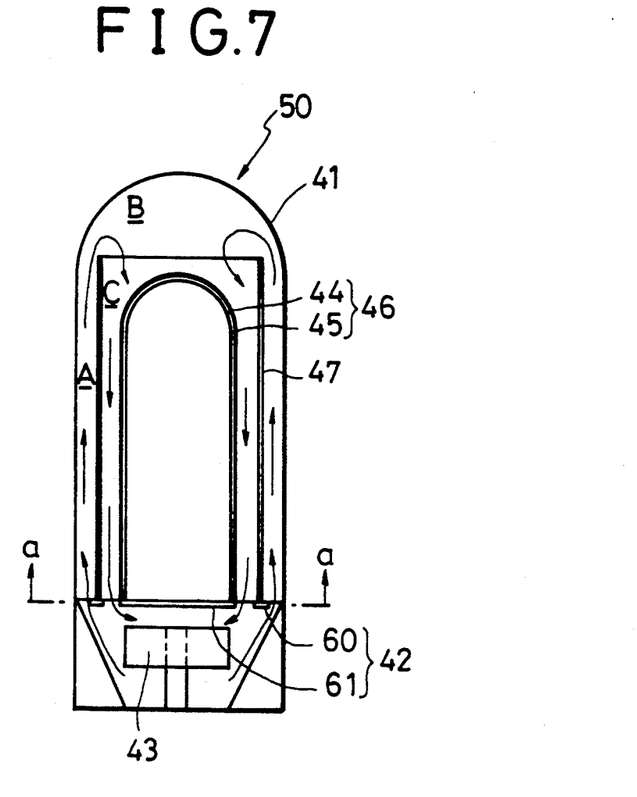
FIG. 7 is a drawing showing another example of the present invention.
Figure 7A:
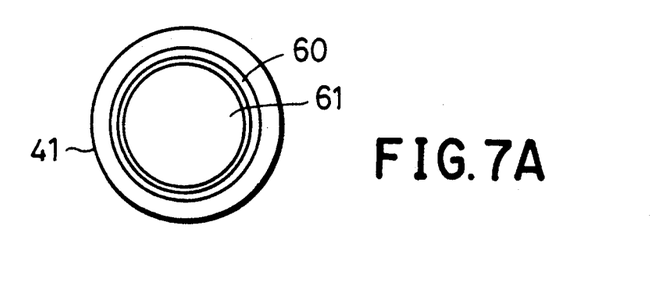
FIG. 7a is an end view along line a—a in FIG. 7.

FIG. 7 shows an example of a firing furnace used for firing a bottomed cylindrical material. In the sectional view and the end view taken at its a—a line shown in FIGS. 7 and 7a, a bearer 42 consisting of a ring-shaped plate 60 and a circular plate 61 is provided in a muffle 41; a fan 43 is provided below the bearer 42; a both ends-opened cylindrical inorganic material 47 is placed on the ring-shaped plate 60 provided with a gap kept against the inner wall of the muffle 41; a material 46 to be fired, consisting of (a) a bottomed cylindrical substrate 44 and (b) a layer 45 to become an oxide superconductive layer when fired, formed on the outer surface of the substrate 44, is placed on the circular plate 61 provided with a gap kept against the ring-shaped plate 60.

Figure 8:
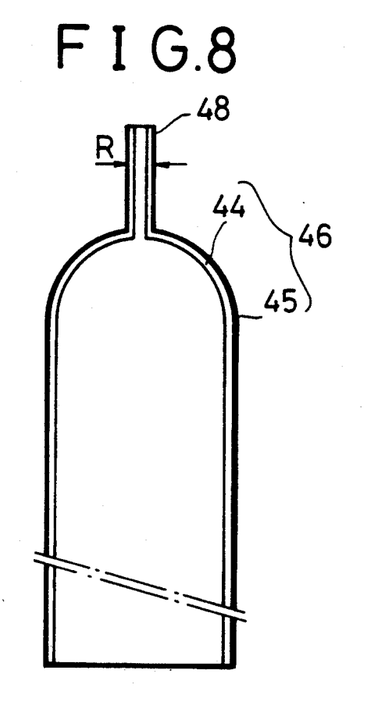
FIG. 8 is a sectional view showing an example of a bottomed cylindrical superconductive material having an inlet for introducing a sensor therein.

After the inside of the muffle 41 of a bell-shaped furnace 10 has been provided as above, the furnace 10 is heated and the fan 43 is actuated to allow the atmosphere gas in the muffle 41 to produce a gas flow of A→B→C in the A, B and C zones defined by the muffle 41, the cylindrical inorganic material 47 and the material 46 to be fired. In this case, the flow rate of the gas flow of A→B→C is preferably 0.1-3.0 m/sec. If the surface area of the material to be fired or the inside volume of the furnace and the sectional area of the gas passage are large, a large amount of a gas must be introduced in order for the introduced gas to have a sufficiently high velocity; this requires the use of a very large amount of a gas and the installation of a very large preheating chamber, which are not preferable in industrial application. However, when the atmosphere inside the furnace is circulated by the fan provided inside the furnace, as in the case of the bell-shaped furnace, the amount of gas introduced can be small. When the atmosphere inside the furnace is circulated, a gas flow rate smaller than 0.1 m/sec incurs the presence of an oxygen-lean layer on the surface of the layer to become an oxide superconductive layer when fired, and a gas flow rate larger than 3.0 m/sec invites in some cases the flying of oxide particles from said surface; resultantly, the resulting cylindrical superconductive material has no excellent superconductivity. The distribution of gas flow rate varies depending upon the thickness, composition and shape of the layer to become an oxide superconductive layer when fired and the type of atmosphere used for firing, but it is preferably controlled so as to fall usually in a range of 50-150% of the average flow rate by appropriately selecting the sizes of cylindrical inorganic material 47 and material 46 to be fired, the gaps between muffle 41 and cylindrical inorganic material 47 and between cylindrical inorganic material 47 and material 46 to be fired, the type and gas-blowing capacity of fan 43, etc. When the distribution of gas flow rate deviates from 50-150% of the average flow rate, the atmosphere in the muffle tends to become nonuniform and the distribution of superconductivity becomes nonuniform. The same operation applies also to a bottomed cylindrical material as shown in FIG. 8, having an inlet 48 for introducing a sensor or the like.

Figure 9:
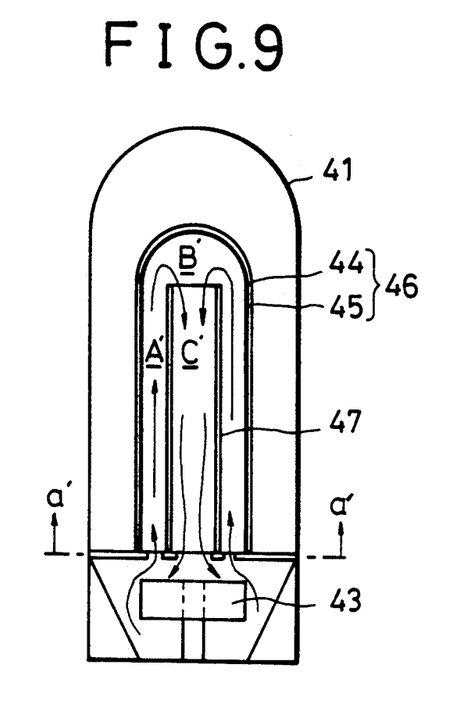
FIG. 9 is a drawing showing still other example of the present invention.

Next, there is described an example of FIG. 9 for firing a material 46 to be fired, consisting of a bottomed cylindrical substrate 44 and a layer 45 to become an oxide superconductive layer when fired, formed on the inner surface of the substrate 44.

Figure 9A:
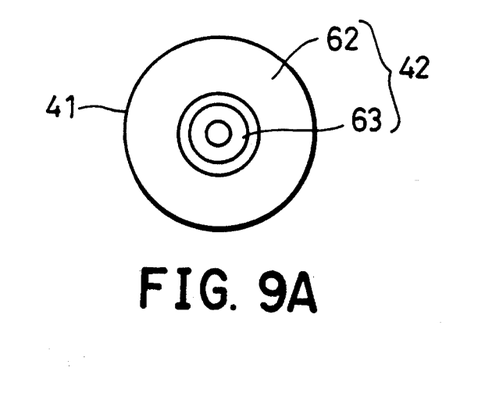
FIG. 9a is an end view along line $a^1$—$a^1$ in FIG. 9.

In the sectional view and the end view taken at its a'—a' line both shown in FIGS. 9 and 9a, the same operation as in the example of FIG. 7 applies except that a bearer 42 is provided in a muffle 41, the bearer 42 consisting of (a) a ring-shaped plate 62 contacting with the inner wall of the muffle 41 and (b) a ring-shaped plate 63 provided with a gap kept against the ring-shaped plate 62, a fan 43 is provided below the bearer 42, a both ends-opened cylindrical inorganic material 47 is placed on the ring-shaped plate 63 of the bearer 42, and a material 46 to be fired, consisting of a bottomed cylindrical substrate 44 and a layer 45 to become an oxide superconductive layer when fired, formed on the inner surface of the substrate 44 is placed on the ring-shaped plate 62.

Figure 10:
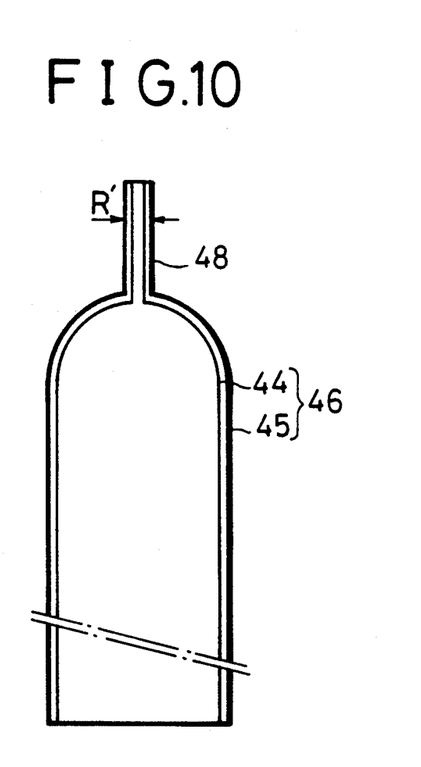
FIG. 10 is a sectional view showing other example of a bottomed cylindrical superconductive material having an inlet for introducing a sensor therein.

In this case, also, the gas in the muffle 41 is allowed to produce a gas flow of A'→B'→C' in the zones A', B' and C' defined by the cylindrical inorganic material 47 and the material 46 to be fired, whereby the composition and temperature of the gas contacting with the layer 45 to become an oxide superconductive layer when fired are made uniform. As in the example shown in FIG. 7, the distribution of gas flow rate in the zones A', B' and C' is controlled to be in a range of 50-150% of the average gas flow rate. The same operation applies also to a bottomed cylindrical material as shown in FIG. 10, having an inlet 48 for introducing a sensor or the like.

In the firing embodiment of FIG. 9, the muffle 41 may be omitted. In that case, a material 46 to be fired, consisting of a bottomed cylindrical substrate 44 and a layer 45 to become an oxide superconductive layer when fired is allowed to act also as a muffle; a cylindrical inorganic material 47 is provided inside the material 46 to be fired; the gas in the material 46 is allowed to produce a gas flow of A'→B'→C'; whereby the composition and temperature of the gas contacting with the layer 45 to become an oxide superconductive layer when fired are made uniform.

In the present invention, the muffle of bell-shaped furnace can be usually made of a stainless steel (e.g. SUS 310S, SUS 430) or a metal (e.g. Inconel). The both ends-opened cylindrical inorganic material is preferably constituted generally by a ceramic (e.g. zirconia $ZrO_2$, alumina $Al_2O_3$), a metal (e.g. Inconel, stainless steel), an emameled metal, an inorganic fiber board or their combination; and there is selected a material which is not deteriorated at the firing temperature used or by the firing gas employed.

In the present invention, the layer to become an oxide superconductive layer when fired can be formed using materials selected so as to be able to give an oxide superconductive material, according to a known method such as spray coating, doctor blade coating, dip coating or the like. The oxide superconductive material is not particularly restricted and can be, for example, any of (a) rare earth element-containing oxide superconductive materials of M-Ba-Cu-O type having a perovskite structure wherein M is at least one rare earth element selected from Sc, Y and lanthanides such as La, Eu, Gd, Er, Yb, Lu and the like, and (b) bithmuth-containing oxide superconductive materials having a composition represented by $Bi_2Sr_2Ca_1Cu_2O_x$ or $Bi_2Sr_2Ca_2Cu_3O_x$.

In the present invention, the substrate can be any as long as it can keep the mechanical strength of the above oxide superconductive material. There can be used, for example, ceramics such as $ZrO_2$, titania ($TiO_2$) and the like, as well as metals such as SUS 430, SUS 310, SUS 304, Inconel, Incolloy, Hastelloy and the like. In the present invention, it is possible to use, between the substrate and the oxide superconductive layer, an intermediate layer acting as a protective material and an adhesive, made of a glass or a nobel metal (e.g. Au, Ag, Pt). The type, thickness, etc. of the intermediate layer can be selected depending upon the use purpose, etc. of the oxide superconductive material obtained.

In the present invention, firing is generally effected by using an oxygen-containing gas and allowing the gas to produce a desired gas flow. The firing temperature can be appropriately selected depending upon the type, etc. of the oxide superconductive material used. For example, the firing of a bithmuth-containing oxide superconductive material can be generally effected by partially melting the material at 875°-900° C. in a uniform oxygen-containing atmosphere, annealing the partial melt at a temperature of 850° C. or less to give rise to crystallization, converting the atmosphere gas to nitrogen and heat-treating the crystal at a temperature of 700° C. or less in a uniform nitrogen atmosphere.

The present invention is hereinafter described more specifically.

EXAMPLES 1-7 OF THE PRESENT INVENTION

As a material to be fired which became an oxide superconductive material when fired, there was used a Y-Ba-Cu-O type compound shaped into a size of 300 mm × 300 mm × 5 mm. A gas passage was formed in a firing furnace by a jig which was a combination of a lightweight fire brick and an inorganic fiber, as shown in FIG. 1. The above compound was placed in the gas passage, and firing was effected under the firing conditions as shown in Table 1, to obtain oxide superconductive materials having properties as shown in Table 1.

EXAMPLES 8-14 OF THE PRESENT INVENTION

As a material to be fired which became an oxide superconductive material when fired, there was used a Bi-Sr-Ca-Cu-O type compound shaped into a size of 300 mm × 300 mm × 0.5 mm. A gas passage was formed in the same manner as in Examples 1-7. A stainless steel substrate was formed in the gas passage, and the above compound was formed on the substrate. Then, firing was effected under the conditions as shown in Table 1, to obtain oxide superconductive materials having properties as shown in Table 1.

EXAMPLE 15 OF THE PRESENT INVENTION

Firing was effected under the same conditions as in Examples 1-7 except that alumina of 15 mm in thickness was used as a jig for formation of gas passage. The results are shown in Table 1.

EXAMPLE 16 OF THE PRESENT INVENTION

Firing was effected under the same conditions as in Examples 8-14 except that alumina of 15 mm in thickness was used as a jig for formation of gas passage. The results are shown in Table 1.

EXAMPLES 17-22 OF THE PRESENT INVENTION

Firing was effected under the same conditions as in Examples 1-7 except that the formation of gas passage in firing furnace was replaced by installation of straightening louvers and fan in firing furnace, as shown in FIG. 2. The results are shown in Table 1.

EXAMPLES 23-28 OF THE PRESENT INVENTION

Firing was effected under the same conditions as in Examples 8-14 except that the formation of gas passage in firing furnace was replaced by installation of straightening louvers and fan in firing furnace, as shown in FIG. 2. The results are shown in Table 1.

EXAMPLES 29-30 OF THE PRESENT INVENTION

Using an apparatus as shown in FIG. 4, a cylindrical material [100φ × 400 mm (length)] to be fired which became an oxide superconductive material when fired was fired under the conditions as shown in Table 1, to obtain oxide superconductive materials having properties as shown in Table 1.

EXAMPLES 31-32 OF THE PRESENT INVENTION

Firing was effected under the same conditions as in Examples 29-30 except that an apparatus as shown in FIG. 5 was used. The results are shown in Table 1.

EXAMPLES 33-34 OF THE PRESENT INVENTION

Using an apparatus as shown in FIG. 6, a cylindrical material [100φ × 400 mm (length)] to be fired which became an oxide superconductive material when fired was fired under the conditions as shown in Table 1, to obtain oxide superconductive materials having properties as shown in Table 1.

COMPARATIVE EXAMPLES 1-6

Firing was effected under the same conditions as in Examples 1-7 except that no gas passage was formed in the firing furnace. The results are shown in Table 2.

COMPARATIVE EXAMPLES 7-12

Firing was effected under the same conditions as in Examples 8-11 except that no gas passage was formed in the firing furnace. The results are shown in Table 2.

TABLE 1

| | Material to be fired which becomes an oxide superconductive material when fired | | | Firing conditions | | |
|---|---|---|---|---|---|---|
| Examples | Composition | Shape (mm) | Remarks | Jig for formation of gas passage | Fan | Straightening louvers |
| 1 | YBCO | 300 × 300 × 5 | Sintered body | Used(*1) | Not used | Not used |
| 2 | " | " | " | " | " | " |
| 3 | " | " | " | " | " | " |
| 4 | " | " | " | " | " | " |
| 5 | " | " | Sintered body, Two packed | " | " | " |
| 6 | " | " | " | " | " | " |
| 7 | " | " | " | " | " | " |
| 8 | BSCCO | 300 × 300 × 0.5 | Thick layer on stainless substrate | " | " | " |
| 9 | " | " | " | " | " | " |
| 10 | " | " | " | " | " | " |
| 11 | " | " | " | " | " | " |
| 12 | " | " | Thick layer on stainless substrate, Two packed | " | " | " |
| 13 | " | " | " | " | " | " |
| 14 | " | " | " | " | " | " |
| 15 | YBCO | 300 × 300 × 5 | Sintered body | Used(Al)(*2) | " | " |
| 16 | BSCCO | 300 × 300 × 0.5 | Thick layer on stainless substrate | " | " | " |
| 17 | YBCO | 300 × 300 × 5 | Sintered body | Not used | Used | Used |
| 18 | " | " | " | " | " | " |
| 19 | " | " | " | " | " | " |
| 20 | " | " | " | " | " | " |
| 21 | " | " | Sintered body, Two packed | " | " | " |
| 22 | " | " | Sintered body, Four packed | " | " | " |
| 23 | BSCCO | 300 × 300 × 0.5 | Thick layer on stainless substrate | " | " | " |
| 24 | " | " | " | " | " | " |
| 25 | " | " | " | " | " | " |
| 26 | " | " | " | " | " | " |
| 27 | " | " | Thick layer on stainless substrate, Two packed | " | " | " |
| 28 | " | " | Thick layer on stainless substrate, Four packed | " | " | " |
| 29 | YBCO | φ 100 × 400 $L$ | Sintered body | Used | Not used | Not used |
| 30 | BSCCO | " | Thick layer on metal substrate | " | " | " |
| 31 | YBCO | " | Sintered body | " | " | " |
| 32 | BSCCO | " | Thick layer on metal substrate | " | " | " |
| 33 | YBCO | " | Sintered body | Not used | Used | Used |
| 34 | BSCO | " | Thick layer on metal substrate | " | " | " |

| | | Firing conditions | | | |
|---|---|---|---|---|---|
| Examples | Gas flow rate (l/min) | Gas flow rate in vicinity of material to be fired(cm/min) | Oxygen concentration at gas outlet (%) | Residual carbon (wt %) | Jc (A/cm$^2$) 77K |
| 1 | 2 | 3.3 | 70 | 0.19 | 93 |
| 2 | 5 | 8.3 | 80 | 0.11 | 114 |
| 3 | 10 | 16.7 | 84 | 0.09 | 125 |
| 4 | 20 | 33.3 | 86 | 0.05 | 148 |
| 5 | 5 | 4.2 | 68 | 0.17 | 90 |
| 6 | 10 | 8.3 | 83 | 0.14 | 108 |
| 7 | 20 | 16.7 | 85 | 0.10 | 116 |
| 8 | 2 | 3.3 | 75 | 0.11 | 880 |
| 9 | 5 | 8.3 | 86 | 0.07 | 1041 |
| 10 | 10 | 16.7 | 88 | 0.04 | 2400 |
| 11 | 20 | 33.3 | 89 | 0.04 | 2600 |
| 12 | 5 | 4.2 | 73 | 0.08 | 988 |
| 13 | 10 | 8.3 | 84 | 0.06 | 1960 |
| 14 | 20 | 16.7 | 88 | 0.04 | 2480 |
| 15 | 10 | 16.7 | 84 | 0.12 | 108 |
| 16 | 10 | 16.7 | 86 | 0.07 | 1070 |
| 17 | 2 | 25.0 | 65 | 0.10 | 107 |
| 18 | 5 | 25.0 | 68 | 0.08 | 128 |
| 19 | 10 | 25.0 | 88 | 0.04 | 150 |
| 20 | 10 | 40.0 | 86 | 0.04 | 168 |
| 21 | 10 | 40.0 | 85 | 0.04 | 153 |
| 22 | 10 | 100.0 | 82 | 0.05 | 148 |
| 23 | 2 | 25.0 | 71 | 0.08 | 1073 |
| 24 | 5 | 25.0 | 78 | 0.06 | 1580 |
| 25 | 10 | 25.0 | 89 | 0.04 | 3280 |
| 26 | 10 | 40.0 | 88 | 0.04 | 3300 |
| 27 | 10 | 40.0 | 87 | 0.04 | 3250 |

TABLE 1-continued

| | | | | | |
|---|---|---|---|---|---|
| 28 | 10 | 100.0 | 85 | 0.04 | 3030 |
| 29 | 10 | 14.2 | 84 | 0.08 | 113 |
| 30 | 10 | 14.2 | 86 | 0.08 | 878 |
| 31 | 10 | 14.2 | 85 | 0.08 | 131 |
| 32 | 10 | 14.2 | 85 | 0.07 | 1205 |
| 33 | 10 | 20.0 | 84 | 0.06 | 145 |
| 34 | 10 | 20.0 | 84 | 0.06 | 1810 |

Notes:
(*1) A combination of a lightweight fire brick and an inorganic fiber.
(*2) Alumina(Al) is 15 mm in thickness.

TABLE 2

| Comparative Examples | Material to be fired which becomes an oxide superconductive material when fired | | | Jig for formation of gas passage | Firing conditions | |
|---|---|---|---|---|---|---|
| | Composition | Shape (mm) | Remarks | | Fan | Straightening louvers |
| 1 | YBCO | 300 × 300 × 5 | Sintered body | Not used | Not used | Not used |
| 2 | " | " | " | " | " | " |
| 3 | " | " | " | " | " | " |
| 4 | " | " | " | " | " | " |
| 5 | " | " | " | " | " | " |
| 6 | " | " | " | " | " | " |
| 7 | BSCCO | 300 × 300 × 0.3 | Thick layer on stainless substrate | " | " | " |
| 8 | " | " | " | " | " | " |
| 9 | " | " | " | " | " | " |
| 10 | " | " | " | " | " | " |
| 11 | " | " | " | " | " | " |
| 12 | " | " | " | " | " | " |

| Comparative Examples | Firing conditions | | | Residual carbon (wt %) | Jc (A/cm$^2$) 77K |
|---|---|---|---|---|---|
| | Gas flow rate (l/min) | Average gas flow rate in firing furnace (cm/min) | Oxygen concentration at gas outlet (%) | | |
| 1 | 2 | 0.40 | 88 | 1.50 | x |
| 2 | 5 | 1.10 | 90 | 0.97 | 10 |
| 3 | 10 | 2.20 | 90 | 0.63 | 22 |
| 4 | 20 | 4.40 | 94 | 0.51 | 28 |
| 5 | 40 | 8.80 | 96 | 0.48 | 31 |
| 6 | 50 | 10.99 | 96 | 0.46 | 37 |
| 7 | 2 | 0.40 | 88 | 1.28 | x |
| 8 | 5 | 1.10 | 90 | 0.81 | 51 |
| 9 | 10 | 2.20 | 90 | 0.47 | 83 |
| 10 | 20 | 4.40 | 95 | 0.33 | 110 |
| 11 | 40 | 8.80 | 97 | 0.21 | 238 |
| 12 | 50 | 10.99 | 97 | 0.20 | 337 |

It is clear from Table 1 and Table 2 that in Examples 1-34 of the present invention wherein a gas passage or straightening louvers and a fan were provided in a firing furnace, as compared with Comparative Examples 1-12 wherein neither gas passage nor straightening louvers/fan were provided, the oxide superconductive materials obtained by firing contained a small amount of residual carbon and had a high critical current density and excellent superconductivity.

EXAMPLES 35-43 OF THE PRESENT INVENTION AND COMPARATIVE EXAMPLES 13-23

Powders of $Bi_2O_3$, $SrCO_3$ and CuO each as a starting material for Bi-containing oxide superconductive material, were mixed in amounts giving a composition of $Bi_2Sr_2CaCu_2O_x$ and then calcinated. The calcinated product was ground by a trommel together with $ZrO_2$ flint pebbles using isopropyl alcohol as a solvent, to obtain a starting material powder for Bi-containing oxide superconductive material.

A cylindrical substrate having a shape as shown in Table 3 was prepared using Inconel 625, SUS 430 or SUS 310S each of 1.98 mm in thickness. On the outer or inner surface of this cylindrical substrate was formed an intermediate layer consisting of a glass layer and a noble metal (Ag) layer or of the latter layer alone. On the intermediate layer was spray-coated or brush-coated the above-obtained powder, whereby a layer to become a Bi-containing oxide superconductive material when fired was formed so that the layer thickness after firing became about 300 μm. Thus, cylindrical materials were obtained. The details of the constitution and formation method of each cylindrical material are shown in Table 3.

Each cylindrical material having, as the outermost layer or the innermost layer, a layer to become a Bi-containing oxide superconductive layer when fired, was fired in one of the firing furnaces of FIGS. 7 to 13 indicated in Table 3, using a both ends-opened cylindrical inorganic material made of Inconel 625 and having a shape as shown in Table 3, at 880°-900° C. for 0.5-2.0 hours in an oxygen-rich gas. The fired product was annealed to about 800° C. at a cooling rate of 0.5° C./min to crystallize it. Incidentally, the lengths of the sensor inlets in Examples 39-41 and Comparative Examples 21-23 were 100 mm (Example 39 and Comparative Example 21), 320 mm (Example 40 and Comparative Examples 22 and 23) and 60 mm (Example 41). After the crystallization, the atmosphere gas was converted to an oxygen-lean gas and the crystal was heat-treated at 450°-700° C. to obtain cylindrical oxide superconductive materials containing Bi.

Each of the cylindrical oxide superconductive materials containing Bi was measured for Jc (critical current density) at various points. The average value of the measurements was compared with the minimum value, and each material was rated according to the following criteria ◯, Δ and X. The results are shown in Table 3.

◯: minimum Jc value/average Jc value × 100 ≧ 60 (%)

Δ: 60 ≧ minimum Jc value/average Jc value × 100 ≧ 30 (%)

X: minimum Jc value/average Jc value × 100 ≧ 30 (%)

As is clear from Examples 35-43 and Comparative Examples 13-23, both ends-opened cylindrical materials, even when fired in a conventional bell-shaped furnace, give oxide superconductive materials which are uniform and which have substantially uniform Jc values (Comparative Examples 13-16). Meanwhile, bottomed cylindrical materials consisting of (a) a bottomed cylindrical substrate and (b) a layer to become an oxide superconductive layer when fired, formed on either surface (outer or inner) of the cylindrical substrate, give oxide superconductive materials, having low Jc values locally and are difficult to fire uniformly (Comparative Examples 17-23).

On the other hand, when there is used the process of the present invention using a both ends-opened cylindrical inorganic material, bottomed cylindrical mateirals consisting of (a) a bottomed cylindrical substrate and (b) a layer to become a Bi-containing oxide superconductive layer when fired, formed on either surface (outer or inner) of the cylindrical substrate, give uniform oxide superconductive materials.

TABLE 3

| | Cylindrical substrate | | | | | Intermediate layer(s) | | Superconductive layer | |
|---|---|---|---|---|---|---|---|---|---|
| | Shape Dia. × Height (mm) | Bottom | Composition | Sensor inlet Presence | Sensor inlet Dia. (mm) | First layer | Second layer | Method of formation | Formed on which surface of substrate |
| Examples | | | | | | | | | |
| 35 | 500 × 2000 | Yes | Inconel 625 | No | — | Glass | Ag | Spraying | Outer surface |
| 36 | 500 × 2000 | Yes | SUS430 | No | — | Glass | Ag | Brush coating | Inner surface |
| 37 | 650 × 2000 | Yes | SUS310S | No | — | — | Ag | Brush coating | Outer surface |
| 38 | 650 × 2000 | Yes | Inconel 625 | No | — | — | Ag | Spraying | Inner surface |
| 39 | 650 × 2000 | Yes | Inconel 625 | Yes | 30 | — | Ag | Spraying | Inner surface |
| 40 | 650 × 2000 | Yes | Inconel 625 | Yes | 100 | — | Ag | Spraying | Inner surface |
| 41 | 1000 × 3000 | Yes | Inconel 625 | Yes | 30 | — | Ag | Spraying | Outer surface |
| 42 | 1000 × 3000 | Yes | Inconel 625 | No | — | Glass | Ag | Spraying | Inner surface |
| 43 | 1000 × 3000 | Yes | Inconel 625 | No | — | — | Ag | Spraying | Inner surface |
| Comparative Examples | | | | | | | | | |
| 13 | 500 × 2000 | No | Inconel 625 | No | — | Glass | Ag | Spraying | Inner Surface |
| 14 | 500 × 2000 | No | SUS430 | No | — | Glass | Ag | Brush coating | Outer surface |
| 15 | 500 × 2000 | No | SUS310S | No | — | — | Ag | Spraying | Inner Surface |
| 16 | 500 × 2000 | No | Inconel 625 | No | — | — | Ag | Spraying | Outer surface |
| 17 | 500 × 2000 | Yes | Inconel 625 | No | — | Glass | Ag | Spraying | Outer surface |
| 18 | 500 × 2000 | Yes | Inconel 625 | No | — | Glass | Ag | Spraying | Inner surface |
| 19 | 500 × 2000 | Yes | Inconel 625 | No | — | — | Ag | Spraying | Outer surface |
| 20 | 500 × 2000 | Yes | Inconel 625 | No | — | — | Ag | Spraying | Inner surface |
| 21 | 650 × 2000 | Yes | Inconel 625 | Yes | 30 | Glass | Ag | Spraying | Inner surface |
| 22 | 650 × 2000 | Yes | Inconel 625 | Yes | 100 | Glass | Ag | Spraying | Inner surface |
| 23 | 650 × 2000 | Yes | Inconel 625 | Yes | 100 | Glass | Ag | Spraying | Outer surface |

| | Cylindrical Inorganic material Shape Dia. × Height (mm) | FIG. | Firing Average flow rate (m/sec) | | | Heat treatment Temperature (°C.) | Evaluation |
|---|---|---|---|---|---|---|---|
| | | | A A' C | B B' D | C C' E | | |
| Examples | | | | | | | |
| 35 | 1000 × 2100 | FIG. 7 | 1.1 | 0.7 | 1.0 | 700 | ◯ |
| 36 | 360 × 1500 | FIG. 9 | 1.1 | 0.9 | 1.0 | 700 | ◯ |
| 37 | 1030 × 2100 | FIG. 7 | 0.5 | 0.4 | 0.5 | 700 | ◯ |
| 38 | 460 × 1500 | FIG. 9 | 0.5 | 0.4 | 0.5 | 700 | ◯ |
| 39 | 460 × 1600 | FIG. 9 | 1.0 | 0.9 | 1.0 | 700 | ◯ |
| 40 | 460 × 1650 | FIG. 9 | 1.0 | 1.0 | 1.0 | 700 | ◯ |
| 41 | 1160 × 3150 | FIG. 7 | 1.0 | 0.9 | 1.0 | 700 | ◯ |
| 42 | 700 × 2500 | FIG. 9 | 0.3 | 0.2 | 0.3 | 700 | ◯ |
| 43 | 710 × 2600 | FIG. 9 | 1.0 | 0.9 | 1.0 | 700 | ◯ |
| Comparative Examples | | | | | | | |
| 13 | — | FIG. 11 | 0.5 | 0.3 | 0.7 | 700 | ◯ |
| 14 | — | FIG. 11 | 1.0 | 0.8 | 0.9 | 700 | ◯ |
| 15 | — | FIG. 11 | 1.0 | 0.8 | 0.9 | 700 | ◯ |
| 16 | — | FIG. 11 | 0.3 | 0.2 | 0.4 | 700 | ◯ |
| 17 | — | FIG. 12 | — | — | — | 700 | X |
| 18 | — | FIG. 13 | — | — | — | 700 | X |
| 19 | — | FIG. 12 | — | — | — | 700 | X |
| 20 | — | FIG. 13 | — | — | — | 700 | X |
| 21 | — | FIG. 13 | — | — | — | 700 | X |
| 22 | — | FIG. 13 | — | — | — | 700 | Δ |
| 23 | — | FIG. 12 | — | — | — | 700 | Δ |

What is claimed is:

1. A process for producing a bottomed cylindrical oxide superconductive material by firing, which process comprises providing a both ends-opened cylindrical inorganic material in the firing zone of a muffle of a bell-shaped furnace, providing, inside the both ends-opened cylindrical inorganic material, a bottomed cylindrical material comprising (a) a bottomed cylindrical substrate and (b) a layer of at least one member selected from the group consisting of a ceramic superconductor powder and an oxide superconductor precursor on the outer surface of the bottomed cylindrical substrate (a), with the bottom of the cylindrical material directed upward, and passing a gas from the outer surface of the both ends-opened cylindrical inorganic material to its inner surface or from the inner surface to the outer surface to keep all of layer (b) in an atmosphere enabling uniform firing, and firing the layer (b) under this condition.

2. A process for producing a bottomed cylindrical oxide superconductive material by firing, which process comprises providing a both ends-opened cylindrical inorganic material in the firing zone of a muffle of a bell-shaped furnace, providing, outside the both ends-opened cylindrical inorganic material, a bottomed cylindrical material comprising (a) a bottomed cylindrical substrate and (b) an oxide superconductor precursor layer formed on the inner surface of the bottomed cylindrical substrate (a), with the bottom of the cylindrical material directed upward, and passing a gas from the outer surface of the both ends-opened cylindrical inorganic material to its inner surface or from the inner surface to the outer surface to keep all of layer (b) in an atmosphere enabling uniform indirect firing, and indirectly firing the layer (b) under this condition.

3. A process for producing a bottomed cylindrical oxide superconductive material by firing according to one of claim 1 or 2, wherein the average flow rate of the gas is 0.1–3.0 m/sec.

4. A process for producing a bottomed cylindrical oxide superconductive material by firing, which process comprises providing. in the firing zone of a bell-shaped furnace, a bottomed cylindrical material comprising (a) a bottomed cylindrical substrate and (b) a layer of an oxide superconductor precursor formed on the inner surface of the bottomed cylindrical substrate (a), with the bottom of the cylindrical material directed upward, providing a both ends-opened cylindrical inorganic material inside the bottomed cylindrical material, and passing a gas from the outer surface of the both ends-opened cylindrical inorganic material to its inner surface or from the inner surface to the outer surface, to keep all of layer (b) in an atmosphere enabling direct, uniform firing, and directly firing the layer (b) under this condition.

5. A process for producing a bottomed cylindrical oxide superconductive material by firing according to claim 4, wherein the average flow rate of the gas is 0.1–3.0 m/sec.

6. A process for producing a bottomed cylindrical oxide superconductive material having a diameter of 50 cm or more by firing, which process comprises providing a both ends-opened cylindrical inorganic material in the firing zone of a muffle of a bell-shaped furnace, providing, inside the both ends-opened cylindrical inorganic material, a bottomed cylindrical material comprising (a) a bottomed cylindrical substrate and (b) a layer of at least one member selected from the group consisting of a ceramic superconductor powder and an oxide superconductor precursor on the outer surface of the bottomed cylindrical substrate (a), with the bottom of the cylindrical material directed upward, and passing a gas from the outer surface of the both ends-opened cylindrical inorganic material to its inner surface or from the inner surface to the outer surface to keep all of layer (b) in an atmosphere enabling uniform firing, and firing the layer (b) under this condition.

7. A process for producing a bottomed cylindrical oxide superconductive material having a diameter of 50 cm or more by firing, which process comprises providing a both ends-opened cylindrical inorganic material in the firing zone of a muffle of a bell-shaped furnace, providing, outside the both ends-opened cylindrical inorganic material, a bottomed cylindrical material comprising (a) a bottomed cylindrical substrate and (b) an oxide superconductor precursor layer formed on the inner surface of the bottomed cylindrical substrate (a), with the bottom of the cylindrical material directed upward, and passing a gas from the outer surface of the both ends-opened cylindrical inorganic material to its inner surface or from the inner surface to the outer surface to keep all of layer (b) in an atmosphere enabling uniform indirect firing, and indirectly firing the layer (b) under this condition.

8. A process for producing a bottomed cylindrical oxide superconductive material having a diameter of 50 cm or more by firing, which process comprises providing, in the firing zone of a bell-shaped furnace, a bottomed cylindrical material comprising (a) a bottomed cylindrical substrate and (b) a layer of an oxide superconductor precursor formed on the inner surface of the bottomed cylindrical material (a), with the bottom of the cylindrical substrate directed upward, providing a both ends-opened cylindrical inorganic material inside the bottomed cylindrical material, and passing a gas from the outer surface of the both ends-opened cylindrical inorganic material to its inner surface or from the inner surface to the outer surface, to keep all of layer (b) in an atmosphere enabling direct, uniform firing, and directly firing the layer (b) under this condition.

* * * * *